United States Patent [19]

Klee et al.

[11] Patent Number: 5,995,359
[45] Date of Patent: Nov. 30, 1999

[54] ELECTRONIC COMPONENT AND METHOD OF MANUFACTURING SAME

[75] Inventors: Mareike K. Klee, Hückelhoven; Hans-Wolfgang Brand; Hans-Otto Jungk, both of Aachen, all of Germany

[73] Assignee: U.S. Philips Corporation, New York, N.Y.

[21] Appl. No.: 08/859,796

[22] Filed: May 19, 1997

Related U.S. Application Data

[63] Continuation-in-part of application No. 08/492,467, Jun. 19, 1995, abandoned.

[30] Foreign Application Priority Data

Jun. 19, 1994 [DE] Germany .............................. 44 21 007

[51] Int. Cl.$^6$ .................................................. H01G 4/008
[52] U.S. Cl. ........................................ 361/305; 361/321.5
[58] Field of Search ................................ 361/301.1, 303, 361/304, 305, 320, 322, 321.1, 321.2, 321.3, 321.4, 321.5

[56] References Cited

U.S. PATENT DOCUMENTS 5,164,808 11/1992 Evans, Jr. et al. ....................... 361/305

FOREIGN PATENT DOCUMENTS

| 0495114A1 | 7/1992 | European Pat. Off. ...... H01L 27/115 |
| 0609081A2 | 8/1994 | European Pat. Off. ..... H01L 21/3205 |
| WO9321637 | 10/1993 | WIPO .............................. G11C 11/22 |

OTHER PUBLICATIONS

Fabrication and properties of expitaxial ferroelectric heterostructures with (SrRuO$_3$) isotropic metallic oxide electrodes. C.B. Eom et al. Applied Physics Letters, (63)18, Nov. 1, 1993, pp. 2570–2572, Woodbury, NY.

Versatile new metalorganic process for preparing superonducting thin films. M.E. Gross et al. Applied Physics Letter 52(2), Jan. 11, 1988, pp. 160–162, Woodbury, NY.

*Primary Examiner*—Kristine Kincaid
*Assistant Examiner*—Anthony Dinkins
*Attorney, Agent, or Firm*—Norman N. Spain

[57] ABSTRACT

An electronic component has a substrate, electrode layers for the bottom electrode, top electrode and, optionally, one or more intermediate electrodes, and has intermediate functional layers, these electrode layers include an electroconductive oxidic compound, at least one electrode layer is composed of EuO$_x$, wherein $1 \leq x \leq 2$, LiTi$_2$O$_4$, LiV$_2$O$_4$, SrVO$_3$, Eu$_x$NbO$_3$, Na$_x$WO$_3$, A$_2$P$_8$W$_{32}$O$_{112}$, wherein A=K, Rb,RTl, Na$_x$Ta$_y$W$_{1-y}$O$_3$, Na$_{1-x}$Sr$_x$NbO$_3$, LaTiO$_3$ CeTiO$_3$, CaVO$_3$, La$_{1-x}$Sr$_x$VO$_3$, SrCoO$_3$, CaRuO$_3$, SrRuO$_3$, BaRuO$_3$, BaPbO$_3$, SrMoO$_3$, Sr$_{0.5}$La$_{0.5}$O$_3$, La$_4$BaCu$_5$O$_{13-x}$, La$_{2-x}$Sr$_x$CuO$_{4-\delta}$, YBa$_2$Cu$_3$O$_{7-\delta}$, Bi$_2$Sr$_2$CaCu$_2$O$_{8+d}$, Bi$_2$Sr$_2$CuO$_{6+d}$, Bi$_2$Sr$_2$Ca$_2$Cu$_3$O$_{10+d}$, Tl$_2$Ba$_2$CaCu$_2$O$_8$, TlBa$_2$CuO$_{6+d}$, Tl$_2$Ba$_2$Ca$_2$Cu$_3$O$_{10+d}$, La$_4$BaCu$_6$O$_{15}$, Gd$_{1-x}$Sr$_x$VO$_3$, CaCrO$_3$, SrFeO$_3$, EuNbO$_3$, SrIrO$_3$, CaMoO$_3$, BaMoO$_3$, Bi$_3$Ru$_3$O$_{11}$, VO$_2$, CrO$_2$, MoO$_2$, WO$_2$, PtO$_2$, RuO$_x$, wherein $1.5 \leq x \leq 2$, IrO$_x$, SnO$_{2-x}$, La$_3$Ni$_2$O$_7$, La$_3$Ni$_3$O$_{10}$, M$_2$V$_2$O$_{7-x}$, wherein M=Tm, Lu, M$_2$Mo$_2$O$_7$, wherein M=Nd,Sm,Gd, Lu$_2$Ru$_2$O$_7$, Pb$_2$Ru$_2$O$_7$, Bi$_2$Ru$_2$O$_7$, Pb$_2$Os$_2$O$_7$, Tl$_2$Os$_2$O$_7$, Pb$_2$Ir$_2$O$_2$, Tl$_2$Rh$_2$O$_{7-x}$, K$_{0.3}$MoO$_3$, Rb$_{0.3}$MoO$_3$, Tl$_{0.3}$MoO$_3$ M$_x$V$_2$O$_5$, wherein M=Cu,Na, Mo$_{17}$O$_{47}$ or Tl$_2$O$_{3-x}$, or of physical mixtures and/or solid solutions of the oxidic compound or physical mixtures and/or solid solutions of the oxidic compounds to which is a 50% by weight of further compounds or metals is added. This electrode layer exhibits an improved adhesion and it does not passivate itself.

20 Claims, No Drawings

— 1 —

ELECTRONIC COMPONENT AND METHOD OF MANUFACTURING SAME

RELATED APPLICATIONS

This application is a continuation-in-part of application Ser. No. 08/492,467, filed Jun. 19, 1995 now abandoned.

BACKGROUND OF THE INVENTION

The invention relates to an electronic thin-film component comprising a substrate, electrode layers for the bottom electrode, top electrode and, optionally, one or more intermediate electrodes, and comprising functional intermediate layers, said electrode layers including electroconductive, oxidic compounds.

Such components can be discrete components or multifunctional, multi-component systems, such as non-volatile ferro-electric memories, dynamic random-access write-read memories, integrated capacitors, thin-film actuators, thin-film resistors, piezo-electric sensors, piezo-electric transducers, pyroelectric sensors, electro-optic components or modules comprising integrated passive components (ICM).

For example, for applications in non-volatile ferro-electric memories, piezo-electric transducers, sensors and actuators as well as pyroelectric sensors, functional layers of perovskites of the composition $PbZr_xTi_{1-x}O_3$, wherein x=0.3–0.7, as well as $Pb_{1-1.5y}La_yZr_xTi_{1-x}O_3$, wherein y=0.3–0.07, x=0.4–0.6, and $Pb_{1-1.5y}La_yTiO_3$, wherein y=0.05–0.16, are stacked between electrodes. High-frequency modules for filtering applications in accordance with the state of the art, comprising capacitors and resistors include combinations of $SiO_2$ and $Si_3N_4$ as the functional layers.

In these and other thin-film components, platinum is used as the electrode material, which is preferred to other electrode materials, such as Cu, Al or Ag/Pd, to preclude reactions of the electrode material with the material of the functional layers, for example perovskites, when said material is sintered during its manufacture in an oxygen atmosphere at 600–800° C. However, connecting the platinum electrode to the substrate is problematic. In order to obtain a good adhesion of the Pt electrode layers to a customary substrate, such as silicon with $SiO_2$ insulating layers, an adhesive layer, for example a thin Ti layer must additionally be provided as an intermediate layer between Si/SiO$_2$ and Pt. Also in the case of optimized electrode layers and adhesive layers, the adhesion of the Pt electrodes after sintering of the perovskite layers is often insufficient. As a result, the entire capacitor assembly including the bottom electrode becomes detached from the substrate during the post-treatment. This is the reason why for many applications high-reliability components can yet not be manufactured.

Apart from the integration of perovskite layers in semiconductor ICs, for example, for integrated capacitors, ferro-electric, non-volatile memories or random-access write-read memories, as well as for pyroelectric and piezo-electric components, perovskite layers are also used in the manufacture of modules comprising integrated passive components. In these modules, the perovskite layers are used as dielectrics in thinfilm capacitors and are deposited between electrodes, such as Pt electrodes. Also in this application, the poor adhesion of platinum layers to substrate materials, such as Si/SiO$_2$ or Al$_2$O$_3$ and to functional layers, such as oxidic perovskite layers comprising $Pb_{1-1.5y}La_yZr_x$, $Ti_{1-x}O_3$ wherein 0.53<x<1 and y=0.05–0.15 or $Pb(Mg, Nb)_xTi_{1-x}O_3$, wherein 0.65<x<1 is clearly a disadvantage.

— 2 —

A further disadvantage of the Ti/Pt electrode layers resides in that this material system can only be deposited by means of vacuum techniques, such as cathode-ray sputtering or electron-beam evaporation. Said methods, however, involve high investments as well as high operating costs as, for example in the case of a cathode ray process, expensive Pt targets must be purchased.

Perovskite layers, such as $PbZr_xTi_{1-x}O_3$, wherein x=0.2–0.7, on Si substrates with a Ti adhesion layer and a Pt layer as bottom electrode as well as a Pt layer as the top electrode are used in a new type of memories, i.e. ferro-electric non-volatile memories. A plurality of investigations have revealed, however, that such ferro-electric memory cells demonstrate, dependent upon the deposition conditions, a greater or smaller degree of fatigue. The switched charge of such ferro-electric memory cells decreases clearly after several hundred switching cycles, as a result of which such memory cells are no longer functional. Although the phenomena responsible for the occurrence of fatigue in these materials are so far unknown, other electrode materials in combination with the known functional layers must be used to eliminate this fatigue.

To overcome this disadvantage, EP-A-0 495 114 proposes a semiconductor component on which a ferro-electric film, forming an active element on a semiconductor substrate, is integrated by means of electrodes which form a laminar structure with the ferro-electric film, one or both of the electrodes forming the laminar structure being an oxidic conductor which is predominantly composed of either ITO (mixed crystal of indium oxide and tin oxide), ruthenium oxide, rhenium oxide, tungsten oxide, chromium oxide or molybdenum oxide. These oxide electrodes are manufactured by means of sputtering. Apart from the ITO layer, these oxide layers are very brittle and, partly, ill conducting.

SUMMARY OF THE INVENTION

Thus, it is an object of the invention to provide an electronic, thin-film component having improved electrode layers which demonstrate an improved adhesion, a satisfactory conductivity and no fatigue, as well as a method of manufacturing such a thin-film component.

According to the invention, this object is achieved in that at least one electrode layer is composed of $EuO_x$, wherein $1 \leq x \leq 2$, $LiTi_2O_4$, $LiV_2O_4$, $SrVO_3$, $Er_xNbO_3$, wherein $0.65 \leq x \leq 0.92$, $RbWO_3$, $Na_xWO_3$, $A_2P_8W_{32}O_{112}$, wherein A=K, Rb or Tl, $Na_xTa_yW_{1-y}O_3$, wherein x=0.64 and x-y=0.18, $Na_{1-x}Sr_xNbO_3$, wherein wherein $0 \leq x \leq 1$, $LaTiO_3$ $CeTiO_3$, $CaVO_3$, $La_{1-x}Sr_xVO_3$, wherein $0.23 \leq x \leq 1$, $SrCoO_3$, $CaRuO_3$, $SrRuO_3$, $BaRuO_3$, $BaPbO_3$, $SrMoO_3$, $Sr_{0.5}La_{0.5}O_3$, $La_4BaCu_5\text{-}0_{13}\text{-x}$, wherein $0 \leq x \leq 1$, $La_{2-x}Sr_xCuO_{4-\delta}$, wherein $0.2 \leq x 0.6$ and $0 \leq d \leq 1$, $YBa_2Cu_3O_{7-\delta}$, wherein $0<\delta<1$, $Bi_2Sr_2CaCu_2O_8+d$ wherein $0 \leq d \leq 0.5$, $BiSr_2CuO_{6+d}$, wherein $0 \leq d \leq 0.5$, $Bi_2Sr_2Ca_2Cu_3O_{10+d}$, wherein $0 \leq d \leq 0.5$, $Tl_2Ba_2CaCu_2O_8$, $TlBa_2CuO_{6+d}$, wherein $0 \leq d \leq 0.5$, $TlBa_2Ca_2Cu_3O_{10+d}$, wherein $0 \leq d \leq 0.5$, $La_4BaCu_6O_{15}$, $Gd_{1-x}Sr_xVO_3$, wherein $0.4 \leq x \leq 0.6$, $CaCrO_3$, $SrFeO_3$, $EuNbO_3$, $SrIrO_3$, $CaMoO_3$, $BaMoO_3$, $Bi_3Ru_3O_{11}$, $VO_2$, $CrO_2$, $MoO_2$, $WO_2$, $RhO_2$, $PtO_2$, $RuO_x$, wherein $1.5 \leq x \leq 2$, $IrO_x$, wherein $1.5 \leq x \leq 2$, $SnO_{22-x}$, $La_3Ni_2O_7$, $La_3Ni_3O_{10}$, $M_2V_2O_{7-x}$, wherein M=Tm or Lu and $0 \leq x \leq 1$, $M_2Mo_2O_7$, wherein M=Nd,Sm,Gd, $Lu_2Ru_2O_7$, $Pb_2Ru_2O_7$, $Bi_2Ru_2O_7$, $Pb_2Os_2O_7$, $Tl_2Os_2O_7$, $Pb_2Ir_2O_2$, $Tl_2Rh_2O_{7-x}$, wherein $0 \leq x \leq 1$, $K_{0.3}MoO_3$, $Rb_{0.3}MoO_3$, $Tl_{0.3}MoO_3$ $M_xV_2O_5$, wherein M=Cu or Na, $Mo_{17}O_{47}$ or $Tl_2O_{3-x}$, wherein $0 \leq x \leq 1$, or of physical mixtures and/or solid solutions of these oxidic compounds or physical mixtures and/or solid solutions of these oxidic compounds to which ≦50% by weight of additional compounds or metals is added.

These electrode layers exhibit an improved adhesion because they form very ductile, flexible layers which do not "form dust", not even when larger layer thicknesses are used. This can probably be attributed to the fact that inorganic-oxidic reaction layers readily form at the interfaces with the substrate or with the functional layers. By virtue of the good connection to the substrate, the transfer resistance is low, voltage peaks are absent and even after relatively long operating times, passivation at the interface does not occur.

The electroconductive oxidic compounds in accordance with the invention are characterized by a very high conductivity. They can be manufactured at low temperatures and do not adversely interact with the customary, functional layers in accordance with the state of the art.

Within the scope of the invention, it is be preferred that the further compounds of the electrode layers are $RuO_2$ or $ReO_3$. Even when these compounds demonstrate a poor adhesion as compact layers, electrode layers comprising a quantity of $RuO_2$ may be very suitable for electro-optical applications and electrode layers comprising a quantity of $ReO_3$ may be very suitable for memory applications.

In a further preferred embodiment, the electrode layers further comprise the compounds $TiO_2$, $SiO_2$ or $Al_2O_3$. As a result of network formation, these compounds lead to an additional increase in the ductility of the electrode layers.

It may further be preferred that the electrode layers further comprise the compound $SnO_2$. Said compound increases the strength of the electrode layer and facilitates the deposition of subsequent layers.

Within the scope of the invention, it may be preferable that the metals included in the electrode layer, in which they form a physical mixture with the inventive oxidic compounds, are platinum, palladium, iridium, gold, silver and/or copper or their alloys. Said metals increase the conductivity of the electrode and simultaneously improve the morphology of the layer, so that the tendency to form hair cracks during the final temperature treatment is suppressed.

The inventive electrode layer can very suitably be used for electronic thin-film components whose functional intermediate layers comprise perovskites. Mutual wettability of the electrode layers comprising the inventive oxidic compounds and the functional perovskites is very good as compared to the metallic electrode layers in accordance with the state of the art, and the difference between the coefficients of thermal expansion is small.

Preferably, the substrate of the electronic thin-film component is composed of Si, GaAs, sapphire, glass, quartz, $ZrO_2$, MgO, $Al_2O_3$ or AlN. The adhesion of the electrode layers comprising the inventive oxidic compounds to the conventional insulation layers on the substrates of Si or GaAs, which are also composed of oxidic compounds, is very good. This also applies to oxidic substrates composed, for example, of MgO, $Al_2O_3$, glass, quartz, $ZrO_2$ or sapphire.

The method of manufacturing the inventive electronic thin-film component is characterized in that one or more electrode layers are produced by coating a substrate or a functional intermediate layer with genuine solutions, sols or suspensions comprising starting compounds for the electroconductive oxidic compounds, by means of a wet-chemical deposition process and a subsequent thermal treatment to form the electroconductive oxidic compounds. Such a method has a number of advantages. First, this method enables an electrode layer comprising oxidic compounds, mixed crystals or physical mixtures of more than one element to be created in a simple manner, by simply mixing the relevant starting compounds and carrying out a co-deposition process. Second, very thin films having a thickness below 200 nm can readily be obtained. Third, the films thus deposited are insensitive to temperature changes, whereas films which are deposited by electroplating, sputtering, CVD or PVD are prone to delamination when they are heated.

Preferably, the starting compounds are metallo-organic compounds or nitrate-containing, halogenide-containing or hydroxide-containing compounds. Metallo-organic compounds can readily be mixed with each other, however, they must be introduced in the oxygen flow in a controlled manner to preclude carbon inclusions. Particularly nitrate-containing compounds have the advantage that they decompose at very low temperatures, thereby contributing oxidizing gases to the reaction, said gases accelerating the formation of oxidic, conductive compounds.

Within the scope of the invention, the wet-chemical deposition process preferably is a centrifugal process. Centrifuging results in very smooth, thin and striation-free layers.

It is further preferred that the coating is provided in a number of layers, because this leads to an increased ductility of the layers.

It may be preferable that the various layers have different compositions, so that a better adaptation of said layers to the substrate or the functional layers can be achieved.

It may alternatively be preferred that the coating is deposited at an increased temperature. This is particularly advantageous for electrode layers which are subject to a substantial degree of shrinkage during sintering. In general, however, it is considered to be an advantage that the method produces crystalline electrode layers at surprisingly low temperatures, so that the thermal load on the component remains small.

It is further preferred to generate also the functional layers by means of a wet-chemical deposition process followed by a thermal treatment. By virtue thereof, a method is obtained which is simple and inexpensive and the layers thus deposited can be sintered at very low temperatures, thereby reducing the thermal load on the assembly of substrate, electrode layers and functional layers during the manufacturing process.

DETAILED DESCRIPTION OF THE INVENTION

For more complete understanding, the invention will be explained now in greater detail. To carry out the inventive, wet-chemical deposition process for the manufacture of conductive, oxidic electrode layers use is made of metallo-organic starting compounds or nitrate-containing, chloride-containing or hydroxide-containing compounds which decompose to form the desired compounds. For the inorganic compounds use is advantageously made of nitrosyl nitrates, such as ruthenium nitrosyl nitrate, nitrosyl halogenides, oxynitrates, hydroxynitrate or acetates, such as lead acetate, which dissolve in organic solvents. For the metallo-organic compounds use can be made of a large number of compounds, such as acetates or salts of acetic acids (carboxylates), alkoxides and β-diketonates, so that the method is very flexible. The metallo-organic compounds can alternatively be prepared in situ by reacting the nitrates, chlorides, hydroxides, and the like, with alcohols, acetic acids, aldehydes, ketones etc. To deposit the metals, use can also very advantageously be made of commercially available resinates. If, for example, the metallo-organic compounds are in the liquid state, they can be directly mixed with each other. Customarily, however, the starting compounds are dissolved in a common solvent, such as isopropanol, n-butanol, xylol or the like. The viscosities of the solutions may range between 25 centipoises and 800 poises, and their drying properties and thixotropy can be set at will. The processes in which metallo-organic compounds are used include the sol-gel process and the metallo-organic deposition process (MOD). The MOD process utilizes starting substances having relatively high molecular weights, such as octanoates and decanoates, which with respect to the hydrolysis reaction are less sensitive than the substances of the sol-gel process. This enables a much simpler process control to be achieved.

These solutions are applied to a substrate. This substrate typically comprises monocrystalline or polycrystalline silicon. However, it may alternatively consist of another, known substrate material such as glass, quartz, sapphire, gallium arsenide, MgO, $ZrO_2$, $Al_2O_3$ or AlN.

In accordance with the present state of the art, silicon substrates are covered with an insulating layer of $SiO_2$, $Al_2O_3$ substrates are covered with a glass layer to obtain a smooth substrate. Other substrates are covered, for example, with bonding layers of palladium or titanium alloys. Within the scope of the invention, the term "substrate" must be understood to include also substrates which are pretreated in said manner.

The substrate can be coated by means of a centrifugal process (spin-on process) or by impregnating, spraying or rolling.

The layers deposited initially are amorphous and comprise solvents and alcoholate groups or other organic or inorganic residues. To create the ceramic electrode layers, a heating treatment must be carried out while the various conversion phases in the electrode layers proceed. In the beginning of the heating process, the layer is dried and the solvents are evaporated. A further increase in temperature causes the organic and inorganic residues to be released in a pyrolysis reaction. As a result, the layer is converted to an inorganic film. Thermal decomposition of the starting compounds is usually carried out in an oxidizing atmosphere, i.e. in oxygen or air. Under these conditions, only the noble metals platinum, palladium, iridium, silver, gold, copper and their alloys form metallic films. Other elements are deposited as oxides. Subsequently, the gel structure is densified. Grain growth commences at 400° C. and crystallization into the desired microstructure begins. In this manner, electrode layers comprising complex oxidic systems with improved properties can be manufactured. Subsequently, the functional layers are deposited on the electrodes thus provided. For the above-mentioned applications, these functional layers are generally made from ferro-electric perovskites, such as lead-zirconium-titanate or doped variants thereof, such as lead-magnesium-niobium-titanate, or barium titanate, combinations of $SiO_2$ with $Si_3N_4$ or pyroelectric layers of $PbSc_{0.5}Ta_{0.5}O_3$. Further functional layers are known to those skilled in the art. Preferably, these layers are also deposited in a wet-chemical deposition process, for example a sol-gel process. Alternatively, use can be made of other processes, such as sputtering or laser ablation.

After these layers have been deposited, they must be subjected to a heat treatment. Typical values are 400–700° C. for 1 minute to 1 hour.

These functional layers are then provided with an intermediate electrode and further functional layers or the top electrode. The top electrode may be an electrode in accordance with the state of the art, for example, of sputtered Pt. A top electrode in accordance with the invention, which comprises wetchemically deposited, conductive, oxidic compounds, should also comprise a high proportion of noble metals. Subsequently, the top electrode is structured by a lithographic process, ion etching or similar processes. Next, the component is subjected to a further heat treatment and, optionally, the functional layer is subjected to further structuring processes.

EXAMPLE 1

Deposition of a thin $RuO_x$ layer on an Si substrate by means of a centrifugal process.

To deposit a thin $RuO_x$ layer, a quantity of 0.3171 g ruthenium-nitrosyl-nitrate was dissolved in 5 ml 1-propanol and passed through a Teflon filter having a pore size of 0.2 μm. The solution thus produced was provided on an Si-(100)-substrate comprising a 0.5 μm thick $SiO_2$ layer which was manufactured by thermal oxidation. After the deposition process, the substrate was thermally treated on a heating plate at 350° C. for 3 minutes. After this treatment, a thin, crystalline, fine-grain $RuO_x$ layer having a thickness of approximately 0.03 μm was obtained. To obtain a layer thickness of approximately 0.1 μm, the coating process was repeated twice.

The ruthenium-containing layer comprises substoichiometric $RuO_x$ which initially forms, even at very low temperatures, a strongly disordered oxide and subsequently electrode layers exhibiting a high crystallinity, a satisfactorily cross-linked morphology and metallic conductivity.

EXEMPLARY EMBODIMENT 2

Deposition of a thin $Pb_2Ru_2O_7$ layer on an Si substrate by means of a centrifugal process.

To deposit a thin $Pb_2Ru_2O_7$ layer, a quantity of 0.3171 g ruthenium-nitrosyl-nitrate and 0.3243 g lead acetate (63.9 wt.% Pb) was dissolved in 5 ml 1-propanol and passed through a Teflon filter having a pore size of 0.2 μm. The solution thus produced was provided on an Si-(100)-substrate comprising a 0.5 μm thick $SiO_2$ layer which was manufactured by thermal oxidation. After this coating process, the substrate was thermally treated on a heating plate at 350° C. for 3 minutes. After this thermal treatment, a thin $Pb_2Ru_2O_7$ layer was obtained. To increase the layer thickness, the coating process was repeated several times.

EXEMPLARY EMBODIMENT 3

Deposition of a $PbZr_xTi_{1-x}O_3$ layer on an $RuO_x$ layer.

To deposit a $PbZr_xTi_{1-x}O_3$ layer on the substrate manufactured in accordance with example 1 and comprising a conductive $RuO_x$ layer as the bottom electrode, the following solutions were prepared. To deposit a first $PbZr_xTi_{1-x}O_3$ layer of the composition $PbZr_{0.35}Ti_{0.65}O_3$, a quantity of 17.97 g lead acetate-tri-hydrate (54.8 wt. % Pb) was dissolved in 60 g methoxy ethanol to which solution 9.34 g titanium-tetra-n-butylate (14.1 wt. % Ti) and 6.57 g zirconium-tetra-n-butylate (20.53 wt. % Zr) were added. This solution was homogeneously mixed. The solution comprising an excess of lead was passed through a Teflon filter having a pore size of approximately 0.2 μm after 24 hours. A substrate manufactured in accordance with exemplary embodiment 1 was coated with this solution having the composition Pb:Zr:Ti=1.1:0.35:0.65. Coating took place by spinning the solution on to the substrate at 2500 revolutions per minute. The coated substrate was heated at a rate of 350° C./min to 550° C., maintained at this temperature for 1 hour and subsequently cooled at a rate of approximately 350° C./min. A further perovskite layer of the composition $PbZr_{0.53}Ti_{0.47}O_3$ was deposited on this perovskite layer. To this end, a solution was manufactured as follows. A quantity of 9.41 g lead-acetate (63.9 wt. % Pb) was dissolved in 13 ml methoxyethanol. A quantity of 4.22 g titanium-tetra-n-butylate (14.1 wt. % Ti) and 6.57 g zirconium-tetra-n-butylate (20.53 wt. %) were dissolved in 3 ml methoxyethanol. The titanium and zirconium-containing solution was added to the lead-acetate solution while stirring. This solution comprises an excess of lead. Further, a hydrolysation solution was prepared from 0.71 ml of distilled water, 0.37 ml of concentrated $HNO_3$ and 26.4 ml methoxyethanol. This hydrolysation solution was added to the solution comprising lead, titanium and zirconium. The solution thus prehydrolysed was passed through a Teflon filter having a pore size of 0.2 μm. The solution was applied to the above-described $PbZr_{0.35}Ti_{0.65}O_3$ layer. The solution having the composition Pb:Zr:Ti=1.1:0.53:0.47 was homogeneously distributed by spinning at 2500 revolutions per minute and converted at 600° C. Subsequently, the layer was heated at a rate of 5° C./min to 650° C. and treated for 30 minutes at this temperature. The layer structure described herein is important for the manufacture of ferro-electric memory cells demonstrating little fatigue.

EXEMPLARY EMBODIMENT 4

Deposition of a $PbZr_xTi_{1-x}O_3$ layer between two conductive $RuO_x$, layers.

To deposit a capacitor arrangement for ferro-electric, non-volatile memory cells demonstrating little fatigue, a $PbZr_xTi_{1-x}O_3$ layer was stacked between two conductive oxidic electrodes, i.e. a bottom electrode and a top electrode. For this purpose, a conductive, oxidic $RuO_x$ layer was deposited on an Si substrate comprising a 0.5 μm thick $SiO_2$ layer. The $RuO_x$ coating process corresponds to that of Exemplary embodiment 1. This $RuO_x$ layer was coated with a $PbZr_{0.35}Ti_{0.65}O_3$ layer and a $PbZr_{0.53}Ti_{0.47}O_3$ layer in accordance with Exemplary embodiment 3. The $PbZr_{0.53}Ti_{0.47}O_3$ layer was provided with an approximately 0.1 μm thick $RuO_x$ layer in accordance with Exemplary embodiment 1.

EXEMPLARY EMBODIMENT 5

Deposition of a $PbMg_{0.33}Nb_{0.67}O_3$ layer on a $RuO_x$ layer. To manufacture thin-film capacitors which adhere well to substrates, such as $Si/SiO_2$, $Al_2O_3$, glass, quartz, a 0.1 μm thick $RuO_x$ layer was deposited in accordance with Exemplary embodiment 1 on an Si substrate comprising a 500 nm thick $SiO_2$ layer. A $PbZr_{0.35}Ti_{0.65}O_3$ layer was deposited thereon by means of a centrifugal process in accordance with Exemplary embodiment 3. This coating was sintered for one minute at 650° C. A $Pb(Mg_{0.33}Nb_{0.67})_{0.65}Ti_{0.45}O_3$ layer was deposited on this perovskite layer by means of a sol-gel process. For the coating solution, a quantity of 1.822 g magnesium ethoxide (21.46 wt. % Mg), 10.24 g niobium ethoxide (29.64 wt. % Nb) and 7.46 g titanium isopropoxide (16.86 wt. % Ti) were dissolved in 104 g ethylene glycol monomethyl ether and refluxed for 24 hours. Further, 56.93 g lead acetate (63.85 wt. % Pb) were dissolved in 185 g ethylene glycol monomethyl ether. A quantity of 61.12 g of the Mg-Nb-Ti solution were mixed with 56.26 g of the lead acetate solution, while stirring, and refluxed for 20 hours. Subsequently, the solution comprising an excess of lead was passed through a Teflon filter having a pore size of 0.2 μm, and the filtrate was provided on the above, pretreated substrate by centrifuging at 2500 revolutions per minute. This coating was sintered at 650° C. for one minute. The process of providing a $Pb(Mg_{0.33}Nb_{0.67})O_3$ layer was repeated 6 times.

EXEMPLARY EMBODIMENT 6

Deposition of a $Pb_{0.82}La_{0.12}Zr_{0.7}Ti_{0.3}O_3$ layer on a $RuO_x$ layer.

To manufacture thin-film capacitors having a high sheet capacitance and a good adhesion to substrates, such as $Si/SiO_2$, $Al_2O_3$, glass, quartz, an Si substrate comprising a 500 nm thick $SiO_2$ layer was provided with a 0.1 μm thick $RuO_x$ layer in accordance with Exemplary embodiment 1. In accordance with Exemplary embodiment 3, a $PbZr_{0.35}Ti_{0.65}O_3$ layer was provided thereon by means of centrifuging. A $Pb_{0.82}La_{0.12}Zr_{0.7}Ti_{0.3}O_3$ layer was deposited on this perovskite layer by means of a sol-gel process. For this purpose, a solution was prepared. For the coating, 8.118 g lead acetate (63.85 wt. % Pb) were dissolved in 30 ml methoxyethanol. A quantity of 7.714 g zirconium n-propoxide (20.68 wt. % Zr), 2,131 g titanium iso-propoxide (16.85 wt. % Ti) and 1.28 g lanthanum acetate hydrate (32.3 wt % La) were added to the Pb solution. The solution comprising an excess of lead was homogeneously mixed, diluted with methoxyethanol in a ratio of 1:1 and subsequently passed through a cellulose acetate filter having a pore size of 0.2 μm. The filtrate was distributed over the substrate carrying $RuO_x$ and $PbZr_{0.35}Ti_{0.65}O_3$ layers by centrifuging at 2000 revolutions per minute. This coating was heated in a diffusion furnace in an oxygen atmosphere at a rate of 400° C./min to 700° C. and maintained at this temperature for 40 minutes, whereafter it was cooled at a rate of approximately 400° C./min. Dependent upon the required layer thickness, this coating process can be repeated a number of times. After the last coating process, the layer is subjected to a final treatment in which it is first heated at a rate of 400° C./min to 700° C., maintained at this temperature for 40 minutes and heated to 750° C. at a rate of 5° C./min, maintained at 750° C. for one hour and then cooled at a rate of 400° C./min.

EXEMPLARY EMBODIMENT 7

Deposition of a $Pb_{0.82}La_{0.12}Zr_{0.7}Ti_{0.3}O_3$ layer on a $Pb_2Ru_2O_7$ layer.

To manufacture thin-film capacitors, an Si substrate comprising a 500 nm thick $SiO_2$ layer was provided with a 0.1 μm thick $Pb_2Ru_2O_7$ layer in accordance with Exemplary embodiment 2. In accordance with Exemplary embodiment 3, a $PbZr_{0.35}Ti_{0.65}O_3$ layer was provided thereon by centrifuging. This perovskite layer was provided with a $Pb_{0.82}La_{0.12}Zr_{0.3}O_3$ layer by means of a sol-gel process in accordance with Exemplary embodiment 7.

EXEMPLARY EMBODIMENT 8

Deposition of a $Pb_{0.93}La_{0.05}Zr_{0.53}Ti_{0.47}O_3$ layer on a $Pb_2Ru_2O_7$ layer.

To deposit a $Pb_{0.93}La_{0.05}Zr_{0.53}Ti_{0.47}O_3$ layer for piezoelectric applications, an Si substrate comprising a 500 nm thick $SiO_2$ layer was provided with a $Pb_2Ru_2O_7$ layer in accordance with Exemplary embodiment 2. In accordance with exemplary embodiment 3, a $PbZr_{0.35}Ti_{0.65}O_3$ layer was provided thereon by centrifuging. This perovskite layer was provided with a $Pb_{0.93}La_{0.05}Zr_{0.53}Ti_{0.47}O_3$ layer by means of a sol-gel process. A solution was prepared for this purpose. For the coating, 10.0 g lead acetate (63.85 wt. % Pb) were dissolved in 35 ml methoxyethanol. A quantity of 6.480 g zirconium-n-propoxide (20.68 wt. % Zr) was dissolved in 7 ml methoxyethanol. A quantity of 3.701 g titanium tetra-n-butylate (14.1 wt. % Ti) and 0.596 g lanthanum acetate hydrate (32.3 wt. % La) were added to this solution. The solution comprising an excess of lead was homogeneously mixed and subsequently diluted with methoxyethanol in a ratio of 1:1, whereafter it was passed through a Teflon filter having a pore size of 0.2 $\mu$m. The filtrate was distributed over the substrate carrying $Pb_2Ru_2O_7$ and $PbZr_{0.35}Ti_{0.65}O_3$ layers by centrifuging at 2000 revolutions per minute. This coating was heated in a diffusion furnace in an oxygen atmosphere at a rate of approximately 400° C./min to 700° C., maintained at this temperature for 1 hour and subsequently cooled at a rate of 400° C./min. Dependent upon the required layer thickness, this coating process can be repeated a number of times. In the last coating process, the layer was heated to 700° C. at a rate of 400° C./min, maintained at this temperature for 40 minutes and subsequently heated to 750° C. at a rate of 5° C./min, treated at 750° C. for one hour and subsequently cooled at a rate of 400° C./min.

EXEMPLARY EMBODIMENT 9

Deposition of an $Sr_{0.5}La_{0.5}CoO_3$ layer and a $PbZr_xTi_{1-x}O_3$ layer on an Si substrate by means of a centrifugal process.

To deposit a thin $Sr_{0.5}La_{0.5}CoO_3$ layer, 1.0270 g strontium octoate (9.38 wt. % Sr) and 1.3297 g cobalt naphtenate were dissolved in 16 ml butanol and 3 ml methanol. A quantity of 0.4847 g lanthanum acetyl acetonate was added to this solution and the solution was homogeneously mixed for 24 hours and passed through a Teflon filter having a pore size of 0.2 $\mu$m. The solution thus prepared was provided on an Si-(100)-substrate comprising a 0.5 $\mu$m thick $SiO_2$ layer which was manufactured by thermal oxidation. Following the coating process, the substrate was treated for 30 minutes at 600° C. This coating process was repeated 5 times. In accordance with Exemplary embodiment 3, this substrate was successively provided with a thin $PbZr_{0.35}Ti_{0.65}O_3$ layer and a thin $PbZr_{0.53}Ti_{0.47}O_3$ layer. These layer stacks are very important for the creation of ferro-electric, non-volatile memory cells demonstrating little fatigue. Electrode layers comprising $La_{0.5}Sr_{0.5}CoO_3$ enhance the epitaxial growth of the perovskite, functional layers and have a positive effect on their properties.

EXEMPLARY EMBODIMENT 10

Deposition of an $Sr_{0.5}La_{0.5}CoO_3$ layer, a $PbZr_xTi_{1-x}O_3$ layer as well as an $Sr_{0.5}La_{0.5}CoO_3$ layer on an Si substrate by means of a centrifugal process.

To create ferro-electric memory cells demonstrating little fatigue, a construction comprising an Si substrate, a 500 nm thick $SiO_2$ layer, an $Sr_{0.5}La_{0.5}CoO_3$ layer as well as a $PbZr_{0.35}Ti_{0.65}O_3$ layer and a $PbZr_{0.35}Ti_{0.47}O_3$ layer was manufactured in accordance with Exemplary embodiment 3. A thin $Sr_{0.5}La_{0.5}CoO_3$ layer was provided on the $Pb_{0.53}Ti_{0.47}O_3$ layer by means of centrifuging. For this purpose, a solution prepared in accordance with Exemplary embodiment 3 was provided on the $Pb_{0.53}Ti_{0.47}O_3$ layer and homogeneously distributed at 2000 revolutions per minute. After the coating treatment, this structure was treated for 30 minutes at 600° C. This coating process was repeated 5 times.

EXEMPLARY EMBODIMENT 11

Deposition of a $PbZr_xTi_{1-x}O_3$ layer on an $RuO_x$ layer.

To deposit a $PbZr_{0.48}Zr_{0.52}O_3$ layer for pyroelectric applications, an Si substrate comprising a 500 nm thick $SiO_2$ layer was provided with an $RuO_x$ layer in accordance with Exemplary embodiment 1. An approximately 0.1 $\mu$m thick $PbZr_{0.35}Ti_{0.65}O_3$ layer comprising the solution described in Exemplary embodiment 3 was deposited on this $RuO_x$ layer. The solution was deposited by centrifuging at 2500 revolutions per minute. To form the $PbZr_{0.35}Ti_{0.65}O_3$ layer, the structure was heated in a diffusion furnace at a rate of approximately 350° C./min to 550° C., maintained at this temperature for 1 hour and subsequently cooled at a rate of approximately 350° C./min. To deposit a perovskite layer of the composition $PbZr_{0.48}Ti_{0.52}O_3$ on this $PbZr_{0.35}Ti_{0.65}O_3$ layer, a solution was prepared as follows. A quantity of 8.650 g lead acetate (63.9 wt. % Pb) was dissolved in 13.1 ml methoxyethanol. A quantity of 4.204 g titanium tetra-n-butylate (14.1 wt. % Ti) and 5.076 g zirconium tetra-n-butylate (20.53 wt. % Zr) were dissolved in 3 ml methoxyethanol. The titanium and zirconium-containing solution was added to the lead acetate solution while stirring. Further, a hydrolyzing solution consisting of 0.64 ml of distilled water, 0.33 ml of concentrated $HNO_3$ and 26.4 ml methoxyethanol was prepared. This hydrolysing solution was added to the solution comprising lead, titanium and zirconium. The thus pre-hydrolysed solution was passed through a Teflon filter having a pore size of 0.2 $\mu$m. This solution comprising an excess of lead was subsequently homogeneously distributed over the substrate of the composition $PbZr_{0.35}Ti_{0.65}O_3$ by means of centrifuging at 2500 revolutions per minute. This structure was fired for one hour at 600° C. Dependent upon the required layer thickness, this coating process can be repeated a number of times. In the last coating process, the layer was prefired for one hour at 600° C., heated to 650° C. at a rate of 5° C./min and treated at this temperature for 30 minutes.

EXEMPLARY EMBODIMENT 12

Deposition of a thin $SrRuO_3$ layer on an Si substrate by centrifuging.

To deposit a thin $SrRuO_3$ layer, 0.2357 g strontium-isopropoxide (37.18 wt. % Sr) were dissolved in 2 ml methoxyethanol. A quantity of 0.3171 g ruthenium-nitrosyl-nitrate was dissolved in 3 ml methoxyethanol. Both solutions were mixed while stirring and, subsequently, passed through a Teflon filter having a pore size of 0.2 $\mu$m. The solution thus prepared was provided on an Si-(100)-substrate comprising an 0.5 $\mu$m thick $SiO_2$ layer which was manufactured by thermal oxidation. Following the coating process, the substrate was thermally treated on a heating plate at 350° C. for 3 minutes. To attain a desired layer thickness, the coating process was repeated a number of times.

EXEMPLARY EMBODIMENT 13

Deposition of a $Pb_{0.82}La_{0.12}Zr_{0.7}Ti_{0.3}O_3$ layer on an $SrRuO_3$ layer.

To manufacture thin-film capacitors having a high sheet capacitance and a satisfactory adhesion to substrates, such as Si/SiO$_2$, Al$_2$O$_3$, glass, quartz, an Si substrate comprising a 500 μm thick SiO$_2$ layer was provided with an SrRuO$_3$ layer in accordance with Exemplary embodiment 14. In accordance with Exemplary embodiment 3, a PbZr$_{0.35}$Ti$_{0.65}$O$_3$ layer was deposited thereon by centrifuging. A Pb$_{0.82}$La$_{0.12}$Zr$_{0.7}$Ti$_{0.3}$O$_3$ layer was deposited on this perovskite layer by means of a sol-gel process. For this purpose, a solution prepared in accordance with Exemplary embodiment 7 was manufactured. The solution was distributed over the substrate comprising SrRuO$_3$ and PbZr$_{0.35}$Ti$_{0.65}$O$_3$ layers by centrifuging at 2000 revolutions per minute. This coating was sintered in a diffusion furnace in an oxygen atmosphere for 1 minute at approximately 750° C. The coating process in which a Pb$_{0.82}$La$_{0.12}$Zr$_{0.7}$Ti$_{0.3}$O$_3$ layer was applied was repeated 4 times.

EXEMPLARY EMBODIMENT 14

Deposition of a thin BaRuO$_3$ layer on an Si substrate by means of a centrifugal process.

To deposit a thin BaRuO$_3$ layer, 0.31572 g barium ethoxide (43.5 wt.% Ba) were dissolved in 5 ml methoxyethanol. A quantity of 0.3171 g ruthenium nitrosyl-nitrate was added to this solution. The solution was passed through a Teflon filter having a pore size of 0.2 μm. The solution thus prepared was provided on an Si-(100)-substrate comprising an 0.5 μm thick SiO$_2$ layer which was manufactured by thermal oxidation. After the coating process, the substrate was thermally treated on a heating plate for 3 minutes at 350° C. To obtain a desired layer thickness, the coating process was repeated a number of times.

EXEMPLARY EMBODIMENT 15

Deposition of a Pb(Mg$_{0.33}$Nb$_{0.67}$)$_{0.65}$Ti$_{0.35}$O$_3$ layer on a BaRuO$_3$ layer.

To manufacture thin-film capacitors which exhibit a good adhesion to substrates, such as Si/SiO$_2$, Al$_2$O$_3$, glass, quartz, an Si substrate comprising a 500 nm thick SiO$_2$ layer was provided with a BaRuO$_3$ layer in accordance with exemplary embodiment 14. In accordance with exemplary embodiment 3, a PbZr$_{0.35}$Ti$_{0.65}$O$_3$ layer was provided thereon by centrifuging. This coating was sintered for one minute at 650° C. A Pb(Mg$_{0.33}$Nb$_{0.67}$)$_{0.65}$Ti$_{0.35}$O$_3$ layer was provided on this perovskite layer by means of a sol-gel process. For the coating solution, the process in accordance with exemplary embodiment 6 was repeated. The solution was provided on the above, pre-treated substrate by centrifuging at 2500 revolutions per minute. This coating was sintered for one minute at 650° C. The process of providing a Pb(Mg$_{0.33}$Nb$_{0.67}$)$_{0.65}$Ti$_{0.35}$O$_3$ coating was repeated 6 times.

EXEMPLARY EMBODIMENT 16

Deposition of a thin (RuO$_x$)$_{0.7}$(TiO$_2$)$_{0.3}$ layer on an Si substrate.

To deposit a thin (RuO$_x$)$_{0.7}$(TiO$_x$)$_{0.3}$ layer, 0.3171 g ruthenium nitrosyl-nitrate and 0.1459 g titanium tetra-n-butylate were dissolved in 5 ml 1-propanol. The solution was passed through a Teflon filter having a pore size of 0.2 μm. The solution thus prepared was provided on an Si(100)-substrate comprising a 0.5 μm thick SiO$_2$ layer. After the coating process, the substrate was thermally treated on a heating plate for 3 minutes at 350° C. To obtain the desired layer thickness, the process was repeated a number of times.

EXEMPLARY EMBODIMENT 17

Deposition of a thin, conductive layer of RuO$_x$, and Pt on an Si substrate.

To deposit a thin, electroconductive layer composed of RuO$_x$: and metallic Pt, 0.3171 g ruthenium nitrosyl-nitrate and 0.1966 g platinum acetylacetonate were dissolved in 8 ml methoxyethanol. The solution was passed through a Teflon filter having a pore size of 0.2 μm. The solution thus prepared was provided on an Si(100)-substrate comprising a 0.5 μm thick SiO$_2$ layer. After the coating process, the substrate was thermally treated in a furnace at 600° C. for 1 minute. To obtain the desired layer thickness, the process was repeated a number of times.

EXEMPLARY EMBODIMENT 18

Deposition of a thin, conductive layer of RuO$_x$ and Pt on an Si substrate.

To deposit a thin, electroconductive layer composed of RuO$_x$ and metallic Pt, 0.3171 g ruthenium-nitrosyl-nitrate and 0.3044 g platinum-hexa-fluoroacetylacetonate were dissolved in 8 ml methoxyethanol. The solution was passed through a Teflon filter having a pore size of 0.2 μm. The solution thus prepared was provided on an Si(100)-substrate comprising a 0.5 μm thick SiO$_2$ layer. After the deposition process, the substrate was thermally treated on a heating plate at 350° C. for 3 minutes. To obtain the desired layer thickness, the process was repeated a number of times. Subsequently, a final treatment was carried out in a furnace at 650° C.

EXEMPLARY EMBODIMENT 19

Deposition of a thin, conductive layer of RuO$_x$ and Pd on an Si substrate.

To deposite a thin, electroconductive layer composed of RuO$_x$, and metallic Pd, 0.3171 g ruthenium nitrosyl-nitrate were dissolved in 5 ml 1-propanol. A quantity of 0.09 g palladium acetate was dissolved in 2 ml acetic acid. The palladium-containing solution was added to the ruthenium solution. The Pd-Ru solution was passed through a Teflon filter having a pore size of 0.2 μm. The solution thus prepared was provided on an Si(100)-substrate comprising a 0.5 μm thick SiO$_2$ layer. After the coating process, the substrate was thermally treated at a temperature of 550° C. for 30 minutes. To obtain the desired layer thickness, the process was repeated a number of times. Subsequently, a final treatment was carried out in a furnace at 600° C.

EXEMPLARY EMBODIMENT 20

Deposition of a thin conductive layer of RuO$_x$ and Pd on an Si substrate.

To deposit a thin, electroconductive layer composed of RuO$_x$ and metallic Pd, 0.3171 g ruthenium nitrosyl-nitrate and 0.1520 g palladium-acetylacetonate were dissolved in 8 ml methoxyethanol. The solution was passed through a Teflon filter having a pore size of 0.2 μm. The solution thus prepared was provided on an Si(100)-substrate comprising a 0.5 μm thick SiO$_2$ layer. After the coating process, the substrate was thermally treated in a furnace at 600° C. for 1 minute. To obtain the desired layer thickness, the process was repeated a number of times.

EXEMPLARY EMBODIMENT 21

Deposition of a thin, conductive layer of RuO$_x$ and Pd on an Si substrate.

To deposit a thin, electroconductive layer composed of RuO$_x$ and metallic Pd, 0.3171 g ruthenium nitrosyl-nitrate was dissolved in 5 ml 1-propanol. A quantity of 0.1153 g palladium nitrate hydrate was dissolved in 0.144 g 2-ethyl hexane acid. The palladium-containing solution was added to the ruthenium solution and after being mixed they were passed through a Teflon filter having a pore size of 0.2 μm. The solution thus prepared was provided on an Si(100)-substrate comprising a 0.5 μm thick $SiO_2$ layer. The layer obtained was thermally treated at a temperature of 350° C. for 5 minutes. The coating process was repeated a number of times until the desired thickness was attained. The component was subjected to a post-treatment in a furnace at a temperature of 600° C. for 1 minute.

EXEMPLARY EMBODIMENT 22

Deposition of a $Pb(Sc_{0.5}Ta_{0.5})O_3$ layer on an $RuO_x$, electrode layer.

To manufacture a $Pb(Sc_{0.5}Ta_{0.5})O_3$ layer at 650° C., an Si substrate comprising a 500 nm thick $SiO_2$ layer was first provided with a 0.5 μm thick $RuO_x$ layer as described in Exemplary embodiment 1. In accordance with Eexemplary embodiment 3, a nucleating layer of $PbZr_{0.35}Ti_{0.65}O_3$ was provided thereon by centrifuging. This coating was sintered at 550° C. for one hour. A $Pb(Sc_{0.5}Ta_{0.5})O_3$ layer was deposited on this base by means of a sol-gel process. For the coating solution, 2.540 g tantalum methoxide (44.5 wt. % Ta) and 2.152 g scandium acetyl acetonate (12.95 wt. % Sc) were dissolved in ethylene glycol monomethyl ether, refluxed for 2 hours and subsequently cooled. Next, 4.640 g lead acetate (64.1 wt. % Pb) were added to the scandium-tantalum solution and said solution was refluxed for 2 more hours. The solution was then passed through a Teflon filter and the filtrate was provided on the prepared substrate by centrifuging at 2500 revolutions per minute. This coating was treated in an oxygen flow at 600° C. for one hour. The coating process in which the lead-scandium-tantalum solution is provided was repeated 3 times. The layer packet was subjected to a thermal aftertreatment in which it was treated in an oxygen flow at 650° C. for one hour.

What is claimed is:

1. An electronic thin-film component comprising a substrate, a bottom electrode layer, a top electrode layer, and comprising intermediate functional layers between said electrode layers, characterized in that at least one electrode layer comprises an electroconductive oxidic compound selected from the group consisting of EuOx, wherein $1 \leq x \leq 2$, $LiTi_2O_4$, $LiV_2O_4$, $SrVO_3$, $Eu_xNbO_3$, wherein $0.65 \leq x \leq 0.92$, $RbWO_3$, $Na_xWO_3$, wherein $1 \leq x \leq 1$, $A_2P_8W_{32}O_{112}$, wherein A=K, Rb or Tl, $Na_xTa_yW_{1-y}O_3$, wherein x=0.64 and x-y=0.18, $Na_{1-x}Sr_xNbO_3$, wherein $1 \leq x \leq 1$, $LaTiO_3$ $CeTiO_3$, $CaVO_3$, $La_{1-x}Sr_xVO_3$, wherein $0.23 \leq x \leq 1$, $SrCoO_3$, $CaRuO_3$, $SrRuO_3$, $BaRuO_3$, $BaPbO_3$, $SrMoO_3$, $Sr_{0.5}La_{0.5}O_3$, $La_4BaCu_5O_{13-x}$, wherein $1 \leq x \leq 1$, $La_{2-x}Sr_xCUO_{4-\delta}$, $YBa_2Cu_3O_{7-\delta}$, wherein $1 \leq 0 \leq 1$, $Bi_2Sr_2CaCu_2O_{8+d}$, $Bi_2Sr_2CuO_{6+d}$, wherein $0 \leq d \leq 0.5$, $Bi_2Sr_2Ca_2Cu_3O_{10+d}$, wherein $0.2 \leq x \leq 0.6$ and $0 \leq d \leq 1$, $Tl_2Ba_2CaCu_2O_8$, $TlBa_2CuO_{6+d}$, wherein $0 \leq d \leq 0.5$, $Tl_2Ba_2Ca_2Cu_3O_{10+d}$, wherein $0 \leq d \leq 0.5$, $La_4BaCu_6O_{15}$, $Gd_{1-x}Sr_xVO_3$, wherein $0.4 \leq x \leq 0.6$, $CaCrO_3$, $SrFeO_3$, $EuNbO_3$, $SrIrO_3$, $CaMoO_3$, $BaMoO_3$, $Bi_3Ru_3O_{11}$, $VO_2$, $CrO_2$, $MoO_2$, $WO_2$, $PtO_2$, $RuO_x$, wherein $1.5 \leq x \leq 2$, $SnO_{2-x}$, wherein $0 \leq x \leq 1$, $La_3Ni_2O_7$, $La_3Ni_3O_{10}$, $M_2V_2O_{7-x}$, wherein M=Tm or Lu and $0 \leq x \leq 1$, $M_2Mo_2O_7$, wherein M=Nd,Sm or Gd, $Lu_2Ru_2O_7$, $Pb_2Ru_2O_7$, $Bi_2Ru_2O_7$, $Pb_2Os_2O_7$, $Tl_2Os_2O_7$, $Pb_2Ir_2O_2$, $Tl_2Rh_2O_{7-x}$, wherein $0 \leq x \leq 1$, $K_{0.3}MoO_3$, $Rb_{0.3}MoO_3$, $Tl_{0.3}MoO_3$ $M_xV_2O_5$, wherein M=Cu or N and $0 \leq x \leq 1$, Na, $Mo_{17}O_{47}$ and $Tl_2O_{3-x}$, wherein $0 \leq x \leq 1$, or of physical mixtures and/or solid solutions of said oxidic compounds or physical mixtures and/or solid solutions of said oxidic compounds to which $\leq 50\%$ by weight of further compounds or metals is added.

2. An electronic thin-film component as claimed in claim 1, characterized in that said at least one electrode layer also contains $ReO_3$ or $RuO_2$.

3. An electronic thin-film component as claimed in claim 2, characterized in that the said at least one electrode layer contains also $TiO_2$, $SiO_2$ or $Al_2O_3$.

4. An electronic thin-film component as claimed in claim 2, characterized in that the said at least one electrode layer also contains $SnO_2$.

5. An electronic thin-film component as claimed in claim 2, characterized in that the intermediate functional layers comprise perovskites.

6. An electronic thin-film component as claimed in claim 2, characterized in that the substrate is composed of Si, GaAs, sapphire, glass, quartz, $Zr)_2$, MgO, $Al_2O_3$ or AIN.

7. An electronic thin-film component as claimed in claim 2 wherein the metals are selected from the group consisting of platinum, palladium, iridium, silver, gold and copper and alloys thereof.

8. An electronic thin-film component as claimed in claim 1, characterized in that the said at least one electrode layer contains also $TiO_2$, $SiO_2$ or $Al_2O_3$.

9. An electronic thin-film component as claimed in claim 8, characterized in that the said at least one electrode layer also contains $SnO_2$.

10. An electronic thin-film component as claimed in claim 8, characterized in that the intermediate functional layers comprise perovskites.

11. An electronic thin-film component as claimed in claim 8, characterized in that the substrate is composed of Si, GaAs, sapphire, glass, quartz, $Zr)_2$, MgO, $Al_2O_3$ or AIN.

12. An electronic thin-film component as claimed in claim 8 wherein the metals are selected from the group consisting of platinum, palladium, iridium, silver, gold and copper and alloys thereof.

13. An electronic thin-film component as claimed in claim 1, characterized in that the said at least one electrode layer also contains $SnO_2$.

14. An electronic thin-film component as claimed in claim 13, characterized in that the intermediate functional layers comprise perovskites.

15. An electronic thin-film component as claimed in claim 13 wherein the metals are selected from the group consisting of platinum, palladium, iridium, silver, gold and copper and alloys thereof.

16. An electronic thin-film component as claimed in claim 1, characterized in that the functional intermediate layers comprise perovskites.

17. An electronic thin-film component as claimed in claim 1, characterized in that the substrate is composed of Si, GaAs, sapphire, glass, quartz, $Zr)_2$, MgO, $Al_2O_3$ or AIN.

18. A method of manufacturing an electronic thin-film component as claimed in claim 1, in which one or more electrode layers are produced by coating a substrate or a functional intermediate layer with pure solutions, sols or suspensions comprising starting compounds for the electroconductive oxidic compounds in organic solvents, by means of a wet-chemical deposition method and a subsequent thermal treatment to form the electroconductive, oxidic compounds.

19. An electronic thin-film component as claimed in claim 1 wherein the metals are selected from the group consisting of platinum, palladium, iridium, silver, gold and copper and alloys thereof.

20. An electronic thin-film component of claim 1 wherein at least one intermediate electrode layer is provided between the top and bottom electrode layers.

* * * * *